United States Patent
Shimizu et al.

(12) 
(10) Patent No.: US 6,242,808 B1
(45) Date of Patent: Jun. 5, 2001

(54) SEMICONDUCTOR DEVICE WITH COPPER WIRING AND SEMICONDUCTOR DEVICE MANUFACTURING METHOD

(75) Inventors: Noriyoshi Shimizu; Hideki Kitada; Nobuyuki Ohtsuka, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/167,540

(22) Filed: Oct. 7, 1998

(30) Foreign Application Priority Data

Apr. 9, 1998 (JP) .................................................. 10-97948

(51) Int. Cl.⁷ ........................... H01L 23/48; H01L 23/52; H01L 29/40
(52) U.S. Cl. ........................... 257/762; 257/751; 257/767; 438/687
(58) Field of Search .................................... 257/751, 762, 257/767; 438/687

(56) References Cited

U.S. PATENT DOCUMENTS 5,969,422 * 10/1999 Ting et al. ........................... 257/765
5,973,400 * 10/1999 Murakami et al. ................... 257/751

FOREIGN PATENT DOCUMENTS 9-69522    3/1997    (JP) .

* cited by examiner

Primary Examiner—Olik Chaudhuri
Assistant Examiner—Ginette Peralta
(74) Attorney, Agent, or Firm—Armstrong, Westerman, Hattori, McLeland & Naughton

(57) ABSTRACT

An interlayer insulation film is deposited on a substrate in which a semiconductor element has been formed. A wiring groove is formed in the interlayer insulation film. A barrier layer, made of a material which prevents the diffusion of Cu atoms, is formed on at least the inner surface of the wring groove and the upper surface of the interlayer insulation film. A seed layer, made of Cu which contains an impurity, -is deposited on the barrier layer. By way of plating, a conductive layer made of Cu is deposited on the seed layer so as to fill the wiring groove. The substrate is heated to precipitate the impurity, contained in the seed layer, on at least an interface between the seed layer and the barrier layer. The conductive layer, the seed layer and the barrier layer are removed until the upper surface of the interlayer insulation film appears, thus performing surface planarization. A method for forming a Cu wiring whose adhesion to the underlying surface is high and whose electromigration resistance is excellent, is attained employing a plating process.

10 Claims, 5 Drawing Sheets

SEMICONDUCTOR DEVICE WITH COPPER WIRING AND SEMICONDUCTOR DEVICE MANUFACTURING METHOD

This application is based on Japanese Patent Application No. 10-97948 filed on Apr. 9, 1998, the entire contents of which are incorporated herein by reference.

BACKGROUND OF THE INVENTION a)Field of the Invention

The present invention relates to a semiconductor device with a Cu wiring and a method for manufacturing the semiconductor device.

b)Description of the Related Art

With the recent improvements in the processing techniques utilized for semiconductor large-scale integration (LSI), the high-density arrangement of wires and the employment of a multilayer structure and thin film technology in forming a wiring have been promoted, as well as the miniaturization of individual elements. The stress applied to the wires and the density of the current flowing through the wires have increased accordingly. When considering typical logic LSI, for example, the density of the current made to flow through a power supply wire is approximately $1 \times 10^5$ $A/cm^2$ in the case of LSI under the 0.35 $\mu$m design rule, while the density of the current in the case of LSI under the 0.25 $\mu$m design rule is higher, i.e., $3 \times 10^5$ $A/cm^2$. In the case of LSI under the 0.18 $\mu$m design rule, the density of the current is $1 \times 10^6$ $A/cm^2$. An increase in the density of the current entails a problem of the wiring breakage owing to electromigration.

Conventionally, aluminum (Al) has been employed as the material of a wiring in LSI. The ability of an Al wiring to withstand electromigration is improved by adding an impurity such as Cu, Si, Ti, Pd or the like to Al or by adopting a stacked structure which is composed of an Al wiring layer and metal layers, between which the Al wiring layer is sandwiched and which are made of metals having high melting points, such as TiN, Ti, TiW, etc.

However, there is a limit to the use of the Al wiring, due to a signal transmission delay depending upon the resistivity of Al and limitations on the density of a current which can be made to flow through the Al wiring.

Cu has received attention as a wiring material which can be substituted for Al. The resistivity of Cu is lower by approximately 37% than that of Al, and a signal transmission delay owing to electric resistance is lower accordingly. Cu, if employed, can increase the density of a current, which can be made to flow through a wiring, up to about ten times that in the case of Al. This is because the melting point and the self-diffusing energy of Cu are higher than those of Al.

Cu is a material which is difficult to finely process with dry etching techniques, and it is therefore difficult to form a Cu wiring with the processing techniques which have been conventionally used to form an Al wiring. In consideration of this, a damascene process of forming a wiring groove in an interlayer insulation film and filling the groove with Cu has received attention. In the case of forming a Cu wiring with the damascene process, it is required to completely fill a via hole and a groove which have a high aspect ratio. Known as such filling processes are a sputtering process, a plating process and a chemical vapor deposition (CVD) process.

In the sputtering process, a Cu film is deposited by sputtering, after which a heat treatment is conducted at 350° C. or higher, thus filling a via hole and a groove with Cu. With the sputtering process, however, it is difficult to completely fill a groove having a high aspect ratio. The approximate aspect ratio of such a groove as can be filled completely is between 1 and 1.5 at most.

In the CVD process, a groove having a high aspect ratio can be filled completely. Generally speaking, however, film growth in the CVD process is slow. This would result in a low throughput and a high manufacturing cost.

In the plating process, a groove is filled by plating Cu. According to electro-plating, a groove having a high aspect ratio can be filled completely, since Cu ions contained in a plating solution can be led up to the bottom of the groove. The film formation speed is relatively high, and therefore the plating process is suitable for use in mass production.

However, the plating process is a wet process. With such a wet process, it would be difficult to form a high-quality Cu film having an excellent ability to endure electromigration. Moreover, the adhesion of the film to the underlying surface would be low.

SUMMARY OF THE INVENTION

It is accordingly an object of the present invention to provide a semiconductor device with a Cu wiring whose adhesion to the underlying surface is high and which has an excellent electromigration resistance.

It is another object of the present invention to provide a method for forming, by plating, a Cu wiring whose adhesion to the underlying surface is high and which has an excellent electromigration resistance.

According to one aspect of the present invention, there is provided a semiconductor device which comprises a substrate, having an insulative surface, and a wiring formed on the substrate; wherein the wiring has a stacked structure including a barrier layer and a Cu layer, the barrier layer is made of a material which prevents Cu atoms contained in the Cu layer from diffusing into the substrate, a precipitated impurity is present at an interface between the barrier layer and the Cu layer, the Cu layer contains the same impurity as the precipitated impurity present at the interface, the impurity concentration at a certain region of the Cu layer being lower, the farther the certain region being from the interface between the Cu layer and the barrier layer.

The precipitated impurity present on the interface between the barrier layer and the Cu layer ensures the improved adhesion of the Cu layer to the barrier layer. The impurity contained in the Cu layer, which impurity is the same as that precipitated on the interface, improves the electromigration resistance of the Cu layer. The farther from the interface between the Cu layer and the barrier layer, the lower impurity concentration of the Cu layer. This enables a decrease in the electric resistance of the Cu layer to be suppressed.

According to another aspect of the present invention, there is provided a semiconductor device manufacturing method comprising: an insulation film deposition step of depositing an interlayer insulation film on a substrate in which a semiconductor element has been formed; a groove formation step of forming a wiring groove in the interlayer insulation film; a barrier layer deposition step of depositing a barrier layer, made of a material which prevents a diffusion of Cu atoms, on an inner surface of the wiring groove and an upper surface of the interlayer insulation film; a seed layer deposition step of depositing, on the barrier layer, a seed layer essentially consisting of Cu which contains an impurity; a conductive layer deposition step of depositing, by plating, a conductive layer consisting of Cu on the seed layer so as to fill the wiring groove; a precipitation step of precipitating the impurity, contained in the seed layer, on at least an interface between the seed layer and the barrier layer by heating the substrate; and a surface planarization step of removing parts of the conductive layer, the seed layer and the barrier layer until the upper surface of the interlayer insulation film appears.

According to another aspect of the present invention, there is provided a semiconductor device manufacturing method comprising: an insulation film deposition step of depositing an interlayer insulation film on a substrate in which a semiconductor element has been formed; a groove formation step of forming a wiring groove in the interlayer insulation film; a barrier layer deposition step of depositing a barrier layer, made of a material which prevents a diffusion of Cu atoms, on an inner surface of the wiring groove and an upper surface of the interlayer insulation film; a stacked structure formation step of forming, on the barrier layer, a stacked structure which includes an impurity layer, consisting of one of a metal and a semiconductor, and a seed layer consisting of Cu; a conductive layer deposition step of depositing, by plating, a conductive layer consisting of Cu on the stacked structure so as to fill the wiring groove; a precipitation step of diffusing atoms contained in the impurity layer into the seed layer and precipitating the atoms on at least an interface between the seed layer and the barrier layer by heating the substrate; and a surface planarization step of removing parts of the conductive layer, the stacked structure and the barrier layer until the upper surface of the interlayer insulation film appears.

The precipitated impurity present on the interface between the barrier layer and the seed layer ensures the improved adhesion of the seed layer to the barrier layer. The impurity contained in the impurity layer would diffuse also into the conductive layer and precipitate on the boundaries between the crystal grains within the conductive layer so as to improve the electromigration resistance of the conductive layer.

As discussed above, the adhesion and the electromigration resistance of the Cu wiring can be improved by precipitating the impurity on the interface between the Cu wiring and the barrier layer.

DETAILED DESCRIPTION OF THE PREFERRED EMBODIMENTS

The method for forming a Cu wiring according to one embodiment of the present invention will now be described with reference to FIGS. 1A to 1C and FIGS. 2A and 2B.

Figure 1A:
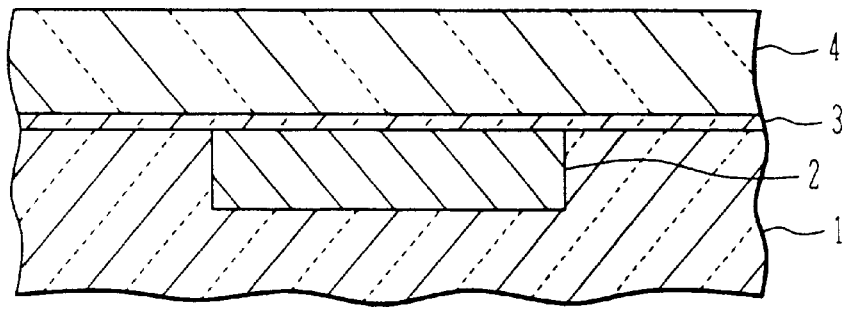
FIGS. 1A to 1C and FIGS. 2A and 2B are diagrams, illustrating cross sections of a wiring layer, for explaining a method for forming a Cu wiring according to one embodiment of the present invention.

As illustrated in FIG. 1A, a lower wiring layer 2 is formed in a part of the upper surface of an interlayer insulation film 1 formed on a semiconductor substrate. An SiN film 3 having a thickness of 30 nm is deposited by CVD on the interlayer insulation film 1 and the lower wiring layer 2. An interlayer insulation film 4, which is made of $SiO_2$ and which has a thickness of 500 nm, is deposited by CVD on the SiN film 3. The SiN film 3 prevents metal atoms constituting the lower wiring layer 2 from diffusing into the interlayer insulation film 4.

Figure 1B:
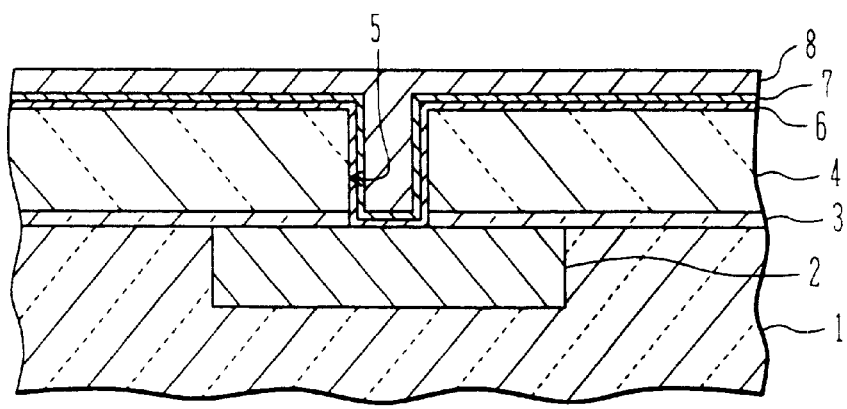

As illustrated in FIG. 1B, a via hole 5 is formed in the interlayer insulation film 4 and the SiN film 3 so that a part of the surface of the lower wiring layer 2 is exposed. A barrier layer 6, which is made of TiN and which has a thickness of 30 nm, is deposited on the inner surface of the via hole 5 and the upper surface of the interlayer insulation film 4. The barrier layer 6 is deposited by the reactive collimation sputtering which is performed using an Ti target, for example, and under the conditions of: an Ar gas flow rate of 10 sccm, an $N_2$ gas flow rate of 60 sccm, a pressure of 4 mTorr, a plasma generating high-frequency power of 8 kW and a substrate temperature of 300° C. The aspect ratio of the collimator is 1:1, for example.

A seed layer 7, having a thickness of 50 nm and made of Cu which contains 0.5% Sn by weight as an impurity, is deposited on the barrier layer 6. The seed layer 7 is deposited by the collimation sputtering which is performed using, for example, a Cu target which contains 0.5% Sn by weight as the impurity, and under the conditions of: an Ar gas flow rate of 50 sccm, a pressure of 2.5 mTorr, a plasma generating high-frequency power of 10 kW and the substrate temperature set at room temperature. The aspect ratio of the collimator is 1:1, for example.

Using the seed layer 7 as an electrode, a conductive layer 8 made of Cu which contains no impurity is deposited on the seed layer 7 by electro-plating. The conductive layer 8 has such a thickness as to fill the via hole 5. After the deposition of the conductive layer 8, a heat treatment is effected at 400° C. for fifteen minutes in a mixed atmosphere of Ar and $H_2$ under a pressure of 100 Torr.

Figure 1C:
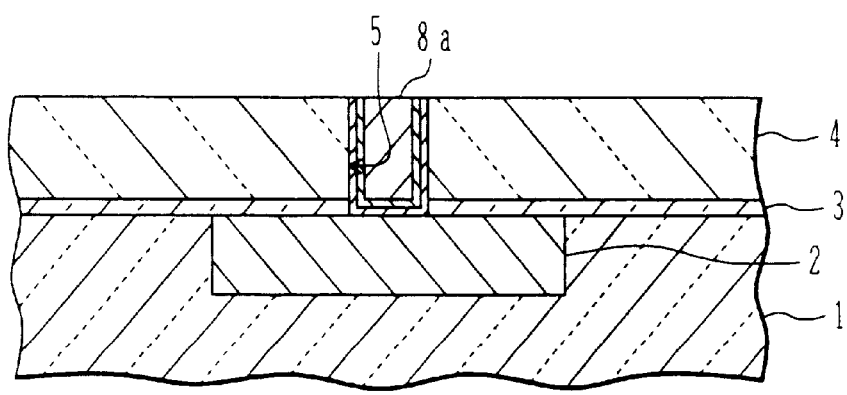

As illustrated in FIG. 1C, chemical-mechanical polishing (CMP) is conducted until the upper surface of the interlayer insulation film 4 is exposed, thereby removing the redundant parts of the barrier layer 6, the seed layer 7 and the conductive layer 8. A conductive plug 8a is left only in the via hole 5.

Figure 2A:
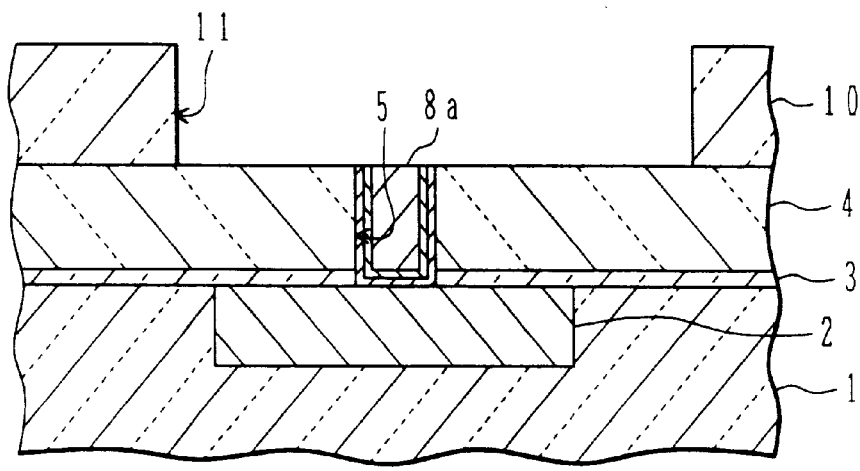

As illustrated in FIG. 2A, an interlayer insulation film 10, which is made of $SiO_2$ and which has a thickness of 500 nm, is deposited so as to cover the surface of the interlayer insulation film 4 and the surface of the conductive plug 8a. A groove 11 is formed in the interlayer insulation film 10 so as to extend therethrough in the direction of the thickness of the interlayer insulation film 10. The surface of the conductive plug 8 is exposed at a part of the bottom of the groove 11.

Figure 2B:
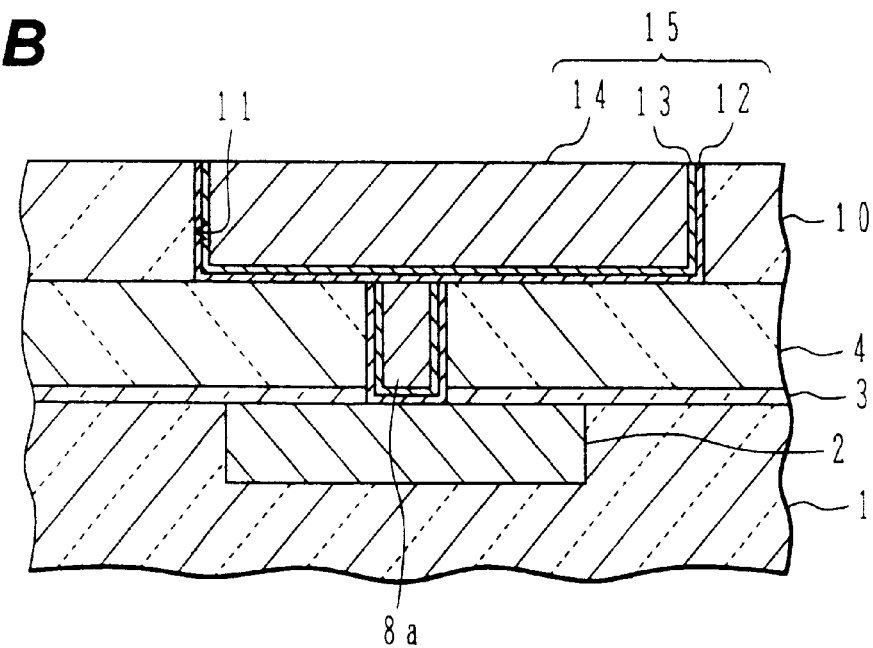

As illustrated in FIG. 2B, the groove 11 is filled with a barrier layer 12 made of TiN, a seed layer 13 made of Cu which contains Sn as the impurity, and a conductive layer 14 made of Cu. This filling process is conducted in the same manner as the deposition of the barrier layer 6, the seed layer 7 and the conductive layer 8 explained with reference to FIG. 1B and the CMP explained with reference to FIG. 1C. By so doing, a wiring 15 is formed which includes three layers, i.e., the barrier layer 12, the seed layer 13 and the conductive layer 14. Then, the heat treatment is effected at 400° C. for fifteen minutes in a mixed atmosphere of Ar and $H_2$ under a pressure of 100 Torr.

Figure 3A:
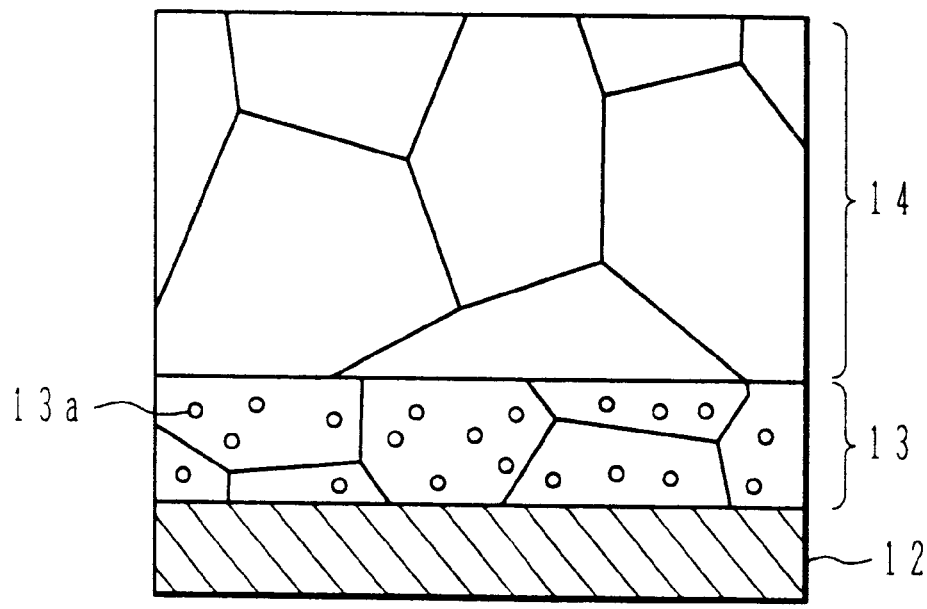
FIGS. 3A and 3B are diagrams schematically illustrating cross sections of a three-layer structure which includes a barrier layer, a seed layer and a conductive layer before and after a heat treatment, respectively.
Figure 3B:
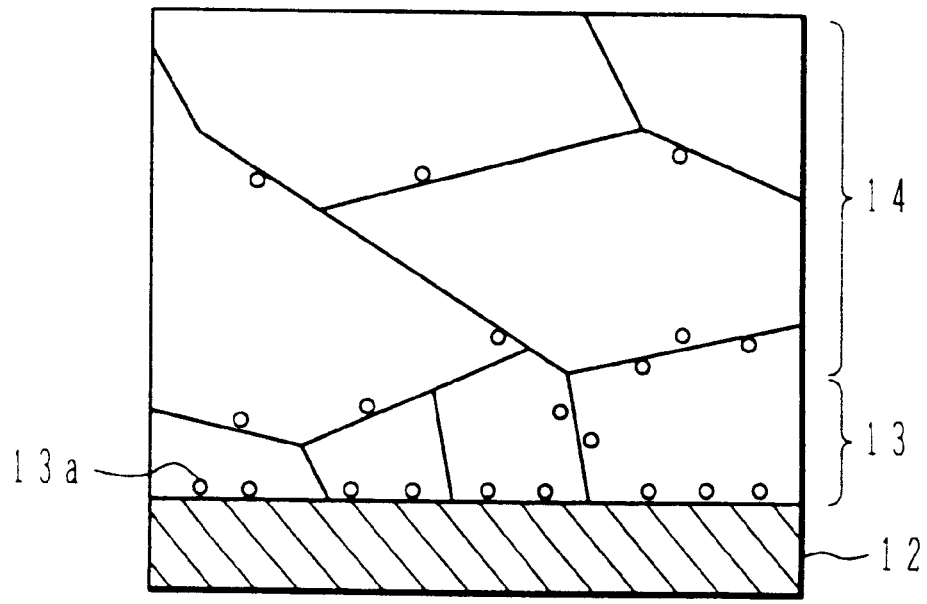

FIGS. 3A and 3B are diagrams schematically illustrating cross sections of the three-layer structure which includes the barrier layer 12, the seed layer 13 and the conductive layer 14 before and after the heat treatment, respectively.

As illustrated in FIG. 3A, the seed layer 13 and the conductive layer 14 are formed of crystal grains. Before the heat treatment, an impurity 13a is in the state of being distributed uniformly within and between the individual crystal grains which constitute the seed layer 13 formed at room temperature.

When the heat treatment is conducted, the seed layer 13 and the conductive layer 14 are recrystallized, with the result that the definite interface between them disappears as illustrated in FIG. 3B. Simultaneously, the impurity 13a contained in the seed layer 13 precipitates on the interface between the seed layer 13 and the barrier layer 12, as well as on the boundaries between the crystal grains within the seed layer 13 and the conductive layer 14. The farther from the interface between the seed layer 13 and the barrier layer 12, the lower impurity concentration. This tendency is remarkable especially in the case of employing an impurity whose diffusion is slow. The conductive layer having such an impurity distribution can be also formed by conducting CVD.

By virtue of the precipitation of the impurity 13a on the interface between the barrier layer 12 and the seed layer 13, the adhesion of the seed layer 13 to the barrier layer 12 is improved.

The impurity 13a, precipitated on the boundaries between the crystal grains within the seed layer 13 and the conductive layer 14, obstructs the movement of Cu atoms due to electromigration. This ensures an improved electromigration resistance. According to a report (in Mat. Res. Soc. Symp. Proc. Vol. 428, p43, 1996), activation energy of electromigration in pure Cu line is 0.75 eV, for example, and the activation energy is increased up to 1.1 eV by the addition of 0.5% Sn by weight. There is also a report that the activation energy is increased up to 1.4 eV by using Zr as the impurity.

It is generally considered that in the case of the electromigration of Cu, the impurity precipitation on the interface between the seed layer and the barrier layer is dominant over that on the boundaries between the crystal grains, unlike in the case of Al. According to the method of the above embodiment, the impurity 13a can be dominantly precipitated on the interface between the seed layer 13 and the barrier layer 12, as illustrated in FIG. 3B. Therefore, any increase in the electric resistance of the seed layer 13 and that of the conductive layer 14 is suppressed, and the electromigration resistance is improved.

In the above-described embodiment, an explanation has been made to the case where the heat treatment in the step shown in FIG. 2B is conducted after CMP. However, the heat treatment may be conducted before CMP. Since the adhesion of the seed layer 13 to the barrier layer 12 is improved by conducting the heat treatment, the detachment of the wiring is prevented from occurring during CMP.

Another embodiment of the present invention will now be described with reference to FIGS. 4A to 4E. In the embodiment described previously, the via hole and the wiring groove are filled at different times. In this embodiment, however, the via hole and the wiring groove are filled simultaneously.

Figure 4A:
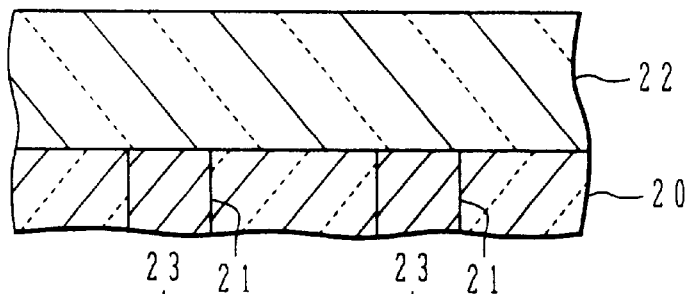
FIGS. 4A to 4E are diagrams, illustrating cross sections of a wiring layer, for explaining a method for forming a Cu wiring according to another embodiment of the present invention.

As illustrated in FIG. 4A, a wiring 21 is formed in a part of the upper surface of an interlayer insulation film 20. An interlayer insulation film 22, which is made of $SiO_2$, is deposited so as to cover the surface of the wiring 21 and that of the interlayer insulation film 20. The interlayer insulation film 22 is deposited in the same manner as the deposition of the interlayer insulation film 4 shown in FIG. 1A.

Figure 4B:
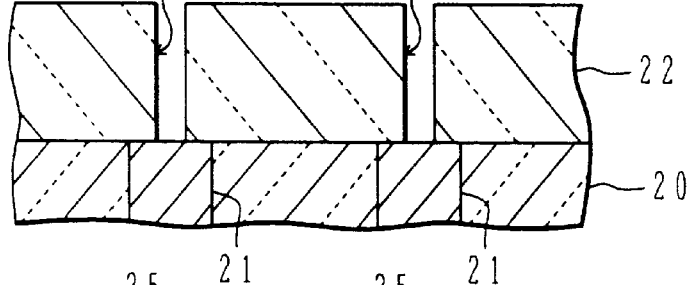

As illustrated in FIG. 4B, via holes 23 are formed in the interlayer insulation film 22 so that parts of surfaces of the wiring 21 are exposed.

Figure 4C:
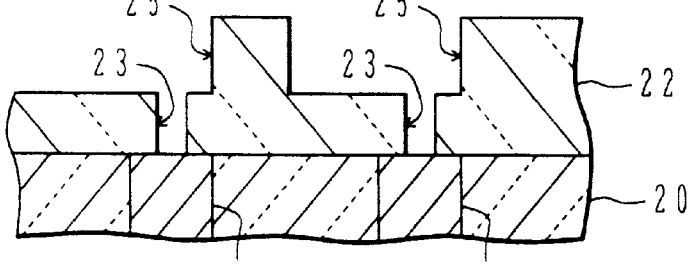

As illustrated in FIG. 4C, wiring grooves 25 which partially overlap the via holes 23 are formed in the interlayer insulation film 22. The depth of the grooves 25 is less than the thickness of the interlayer insulation film 22. The via holes 23 are open at parts of the bottoms of the grooves 25. The via holes 23 and the grooves 25 are formed by the dry etching which uses $CF_4$ as an etching gas.

Figure 4D:
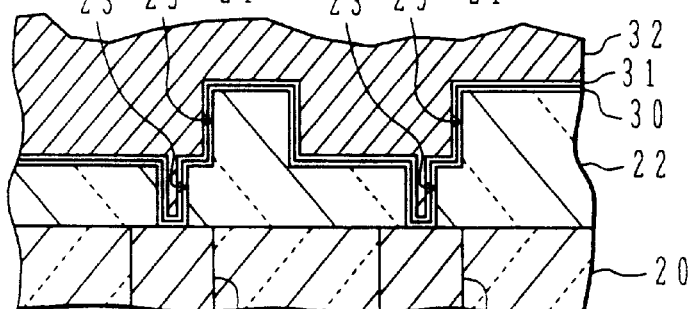

As illustrated in FIG. 4D, a barrier layer 30 made of TiN, and a seed layer 31 made of Cu which contains 0.5% Sn by weight, are sequentially deposited on the inner surfaces of the via holes 23 and the grooves 25, as well as on the upper surface of the interlayer insulation film 22. The barrier layer 30 and the seed layer 31 are deposited in the same manner as the deposition of the barrier layer 6 and the seed layer 7 shown in FIG. 1B. A conductive layer 32 made of Cu which contains no impurity, is deposited on the seed layer 31. The conductive layer 32 is deposited in the same manner as the deposition of the conductive layer 8 shown in FIG. 1B. After the deposition of the conductive layer 32, the heat treatment is conducted at 400° C. for fifteen minutes in a mixed atmosphere of Ar and $H_2$ under a pressure of 100 Torr, as in the case of FIG. 1B.

Figure 4E:
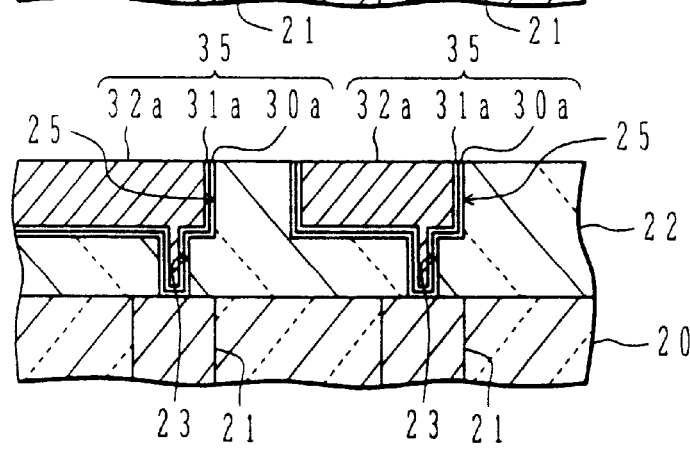

As illustrated in FIG. 4E, the redundant part of the stacked structure, which structure includes the barrier layer 30, the seed layer 31 and the conductive layer 32, is removed by CMP, thus performing surface planarization. A barrier layer 30a, a seed layer 31a and a conductive layer 32a are left only in the via holes 23 and the grooves 25. A wiring 35, which includes the barrier layer 30a, the seed layer 31a and the conductive layer 32a, is thus formed.

Similarly in the embodiment shown in FIGS. 4A to 4E, the impurity is precipitated on the interface between the barrier layer 30a and the seed layer 31a such that the adhesion of the seed layer 31a and the conductive layer 32a and the electromigration resistance are improved.

According to the two embodiments explained above, the barrier layers 6 and 30 are deposited by way of collimation sputtering in the steps shown in FIGS. 1B and 4D. However, the barrier layers 6 and 30 may be deposited by other ways. For example, they may be deposited by a directional sputtering process such as an ionization sputtering process, a low-pressure sputtering process, a long throw sputtering process or the like. The use of TiN as the barrier layers has been explained in the above embodiments. However, other materials like Ta, TaN, W, WN, TiSiN, etc., which can prevent the diffusion of Cu, may be adopted.

In the above embodiments, the seed layers 7 and 31 are deposited by way of collimation sputtering in the steps shown in FIGS. 1B and 4D. However, the seed layers 7 and 31 may be deposited by other ways. They may be deposited by either the aforementioned directional sputtering process or a metal organic chemical vapor deposition (MOCVD) process. For example, the MOCVD process can be conducted using Cu (hfac) (tmvs) (copper-hexafluoroacetylacetoneto-trimethylvinylsilane) as Cu source material, using tetramethyl tin as Sn source material, employing $H_2$ as a carrier gas, and under the conditions of: a substrate temperature of 170° C., a pressure of 1 Torr, a material supply rate of 0.3 g/min, and a carrier gas flow rate of 500 sccm.

Furthermore, in the above embodiments, an explanation has been made to the case where the seed layer 13 illustrated in FIG. 3A contains Sn as the impurity 13a. However, it may contain any other impurity like Cr, Mg, Zr, Pd, Al, Ti, Ag, for example.

Moreover, in the above embodiments, an explanation has been made to the case where the impurity 13a is contained in the seed layer 13 as illustrated in FIG. 3A. However, the seed layer and a thin impurity layer may be stacked on each other. The order in which those two layers are stacked is arbitrary.

Furthermore, in the above embodiments, an explanation has been made to the case where the conductive layers 8 and 32, which are made of Cu, are deposited by way of electroplating in the steps shown in FIGS. 1B and 4D. However, they may be deposited by electroless plating.

Further, according to the above embodiments, the heat treatment in the steps shown in FIGS. 1B, 2B and 4D is conducted in a mixed atmosphere of Ar and $H_2$. However, this is to prevent the oxidization of Cu. The heat treatment can therefore be performed in a vacuum. In that case, it is preferred that the pressure be set at $1 \times 10^{-3}$ Torr or lower. Moreover, it is preferred that the heat treatment be conducted at a temperature of 300° C. or higher in order to promote the recrystallization of Cu.

Figure 5:
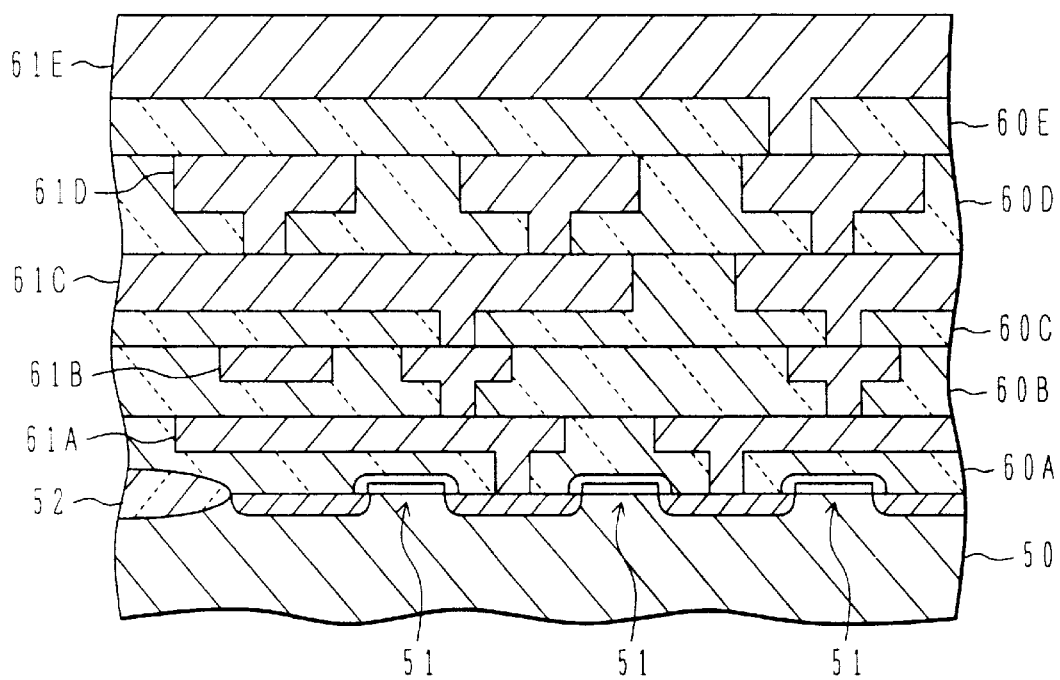
FIG. 5 is a diagram illustrating a cross section of a semiconductor device adopting one of the two aforementioned embodiments of the present invention.

FIG. 5 is a diagram showing a cross section of a semiconductor device employing the Cu wiring forming method according to one of the above-described embodiments. A field oxide film 52 is formed in a surface of a silicon substrate 50 so as to define active regions. A plurality of MOSFETs 51 are formed in the active regions. Five wiring layers, 61A to 61E, are formed on the substrate. The wiring layers 61A to 61E are insulated from each other by interlayer insulation films 60A to 60E. The interlayer insulation films 60A to 60E and their corresponding wiring layers 61A to 61E are formed by the method of one of the two aforementioned embodiments.

Since the wiring layers 61A to 61E are deposited by plating, a high throughput can be realized. Moreover, since the wiring layers 61A to 61E are lower in resistance than an Al wiring, the signal transmission speed is higher accordingly, with the result that a higher processing speed is attained. Furthermore, the wiring layers 61A to 61E have an excellent electromigration resistance, which enhances the device's reliability.

The present invention has been explained while referring to the above embodiments. However, the present invention is not limited thereto, and various modifications, improvements and combinations are available, as should be apparent from a person skilled in the art.

What is claimed is:

1. A semiconductor device comprising:
   a substrate having an insulative surface; and
   a wiring formed on said substrate;
   wherein said wiring has a stacked structure including a barrier layer and a Cu layer, said barrier layer is made of a material which prevents Cu atoms contained in said Cu layer from diffusing into said substrate, a precipitated impurity is present at an interface between said barrier layer and said Cu layer, said Cu layer contains the same impurity as the precipitated impurity present at said interface, an impurity concentration at a certain region of said Cu layer being lower, the farther the certain region being from the interface between said Cu layer and said barrier layer.

2. The semiconductor device according to claim 1, wherein said impurity is at least one impurity selected from a group consisting of Cr, Mg, Zr, Sn, Pd, Ag, Ti and Al.

3. A semiconductor device according to claim 1, wherein the impurity concentration in said Cu layer changes gradually in a thickness direction.

4. A semiconductor device according to claim 1, wherein said Cu layer does not include a crystallographic definite interface along a surface of the barrier layer.

5. A semiconductor device according to claim 1, wherein the impurity is arranged on boundaries between crystal grains.

6. A semiconductor device comprising:
   a substrate having an insulative surface; and
   a wiring formed on said substrate;
   wherein said wiring has a stacked structure consisting of a barrier layer and a Cu layer, said barrier layer is made of a material which prevents Cu atoms contained in said Cu layer diffusing into said substrate, a precipitated impurity is present at an interface between said barrier layer and said Cu layer, said Cu layer contains the same impurity as the precipitated impurity present at said interface.

7. The semiconductor device according to claim 6, wherein said impurity is at least one impurity selected from a group consisting of Cr, Mg, Sr, Sn, Pd, Ag, Ti and Al.

8. A semiconductor device according to claim 6, wherein the impurity concentration in said Cu layer changes gradually in a thickness direction.

9. A semiconductor device according to claim 6, wherein said Cu layer does not include a crystallographic definite interface along a surface of the barrier layer.

10. A semiconductor device according to claim 6, wherein the impurity is arranged on boundaries between crystal grains.

* * * * *